(12) United States Patent
Mittal et al.

(10) Patent No.: US 10,812,055 B2
(45) Date of Patent: Oct. 20, 2020

(54) FLIP FLOP CIRCUIT

(71) Applicant: Samsung Electronics Co., Ltd., Suwon-si (KR)

(72) Inventors: Sajal Mittal, Bangalore (IN); Aroma Bhat, Bangalore (IN); Hareharan Nagarajan, Bangalore (IN); Rahul Kataria, Bangalore (IN); Abhishek Ghosh, Bangalore (IN)

(73) Assignee: SAMSUNG ELECTRONICS CO., LTD., Samsung-ro, Yeongtong-gu, Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/661,205

(22) Filed: Oct. 23, 2019

(65) Prior Publication Data

US 2020/0136594 A1 Apr. 30, 2020

(30) Foreign Application Priority Data

Oct. 23, 2018 (IN) .............................. 201841040015

(51) Int. Cl.
*H03K 3/356* (2006.01)
*H03K 3/037* (2006.01)

(52) U.S. Cl.
CPC .................................. *H03K 3/0372* (2013.01)

(58) Field of Classification Search
CPC ...... H03K 3/012; H03K 3/037; H03K 3/0372; H03K 3/0375; H03K 3/3562; H03K 3/35625; H03K 3/356104; H03K 3/356121; H03K 17/693; G11C 11/412; G11C 11/413; G11C 11/419; G11C 11/4125; H01L 27/1104

See application file for complete search history.

(56) References Cited

U.S. PATENT DOCUMENTS

| 6,573,775 | B2 * | 6/2003 | Pilling ............. H03K 3/356139 327/202 |
|---|---|---|---|
| 7,639,056 | B2 | 12/2009 | Gururajarao et al. |
| 8,253,464 | B2 * | 8/2012 | Jain .................... H03K 3/35625 327/200 |
| 2007/0146034 | A1 | 6/2007 | Acharya | |

* cited by examiner

*Primary Examiner* — Long Nguyen
(74) *Attorney, Agent, or Firm* — Muir Patent Law, PLLC (57) ABSTRACT

Embodiments herein disclose a flip flop comprising at least one of a slave circuit and a retention circuit receiving an input from a master circuit. The output circuit receives an input (X1) from at least one of the slave circuit and the retention circuit. A first node and a second node in the retention circuit receive a power supply from a global power supply through transistors, when a retention is 0 in the retention circuit, so that the slave circuit retains a current state of the X1 and X2 irrespective of a clock input in the slave circuit, and the output circuit receives the stored state of the retention circuit, when a local power supply is turned ON.

20 Claims, 5 Drawing Sheets

FLIP FLOP CIRCUIT

CROSS-REFERENCE TO RELATED APPLICATION

This application claims the benefit of Indian Patent Application Number 201841040015 filed on Oct. 23, 2018, the disclosure of which is incorporated herein its entirety by reference.

BACKGROUND

The present disclosure relates to a flip-flop, and more specifically is related to a power efficient True-Single-Phase-Clock (TSPC) data-retention edge-triggered flip-flop for a standard-cell library.

For low power chip, a number of power components out of which clock power is very critical. The clock power is a major contributor to the total block power hence optimizing the clock power for flip-flop circuits will help us in reducing the overall power. Conventional stacking technique is helpful in reducing the power. Further, removal of single-stacked structures helps in reducing power. However, the conventional stacking technique degrades flip-flop performance which impacts overall frequency and increase the total area.

Figure 1:
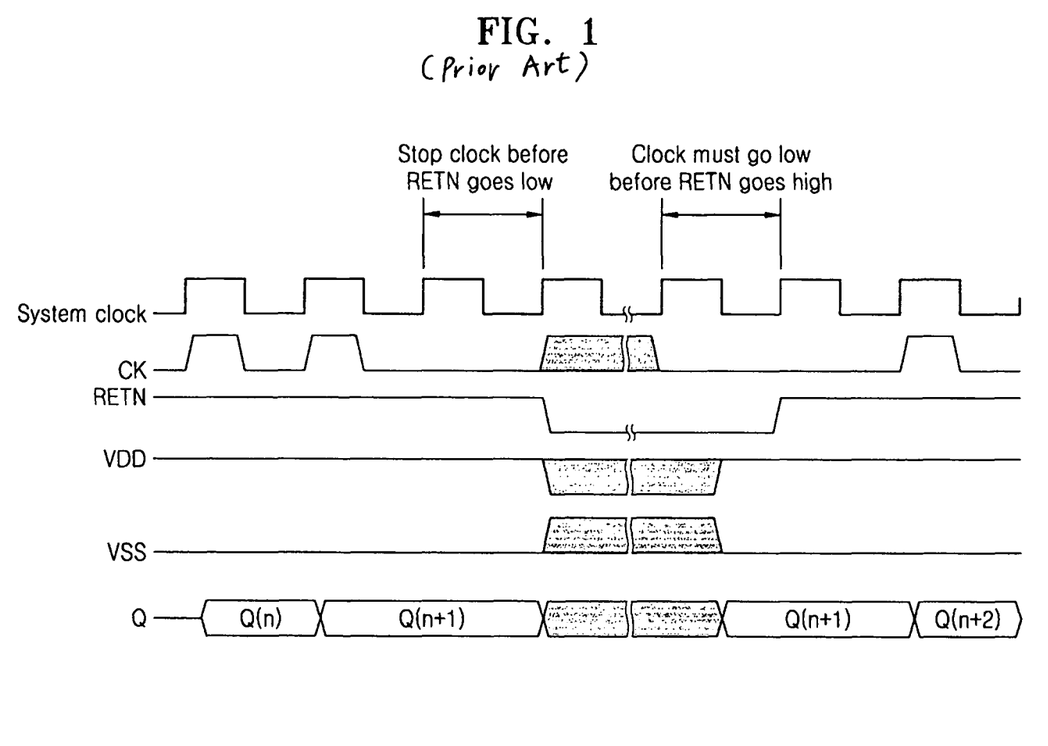
FIG. 1 is a graphical diagram illustrates DRLK caution in a retention flip flop, which is a pre-requisite for proper functioning of any DRLK flop.

FIG. 1 is a graphical diagram illustrates Data Retention Logic Kit (DRLK) caution in a data retention flip-flop, which is a pre-requisite for proper functioning of any DRLK flop. It should be ensured that a local clock CK is low before a local power supply VDD is switched OFF and RETN pin enters active LOW state, so that the correct state is retained in the Flip-Flop. Ignoring at least one clock between CK and RETN transitions, to avoid on-chip and process variation, prevents retention failure.

Thus, it is desired to address the above mentioned disadvantages or other shortcomings or at least provide a useful alternative.

OBJECT OF INVENTION

The principal object of the embodiments herein is to provide a TSPC data-retention edge-triggered flip-flop for a standard-cell library.

SUMMARY

Accordingly, embodiments herein provides a flip flop comprising an input circuit, a master circuit, a slave circuit comprising a retention circuit, and an output circuit. The master circuit receives an input (D or Db) from the input circuit. At least one of the slave circuit and the retention circuit receives an input (nn3 or nn4) from the master circuit. The output circuit receives an input from a node (X1) from at least one of the slave circuit and the retention circuit. A first node (n1) and a second node (n2) in the retention circuit receive a power supply from a global power supply (VDDG) through transistors (MP13 and MP15), when a retention signal (RETN) is low ("0") in the retention circuit, so that the slave circuit retains a current state of the node (X1) and a node (X2) irrespective of a clock input in the slave circuit, and the output circuit receives the stored state of the retention circuit, when a local power supply is turned ON.

In an embodiment, if the retention signal (RETN) is low then, the retention signal (RETN) enables the slave circuit in a retention mode, so that the slave circuit retains a current state of the X1 and X2 irrespective of the clock input when the local power supply is turned ON.

In an embodiment, the retention signal (RETN) is low, the first node (n1) and the second node (n2) receive the global power supply (VDDG) through transistors (MP11 and MP13), wherein the first node (n1) and the second node (n2) supply the global power supply (VDDG) to a latch formed by transistors (MP7, MN7, MP9 and MN9).

In an embodiment, the input circuit receives the input (D) and provides an inverted output (Db) based on the received input.

In an embodiment, the input circuit comprises the input (D) provided to a gate of transistors (MP0 and MN0), wherein a ground voltage (VSS) is provided to a source of the transistor (MN0) and a power supply (VDD) is provided to a source of the transistors (MP0), wherein the inverted output (Db) is provided at a drain of the transistor (MP0) and a drain of the transistor (MN0) based on the received input (D).

In an embodiment, the master circuit receives the input (D) and the inverted output (Db) from the input circuit. In the master circuit, a current state of a node (nn3) and a node (nn4) corresponding to a transistor from a plurality of transistor is modified based on the received input (D) and the inverted output (Db), when a clock is low. The master circuit retains a value of a previous state of the node (nn3) and the node (nn4), wherein the clock is high, even if the input (D) and the inverted output (Db) changes in the master circuit. The master circuit does not generate any new value, wherein the clock is high. The master circuit creates a value based on the received input from the input circuit, wherein the clock is low.

In an embodiment, a transistor (MP1) and a transistor (MN2) form an inverter with the node (nn3), and a transistor (MP4) and a transistor (MN4) form an inverter with the node (nn4), wherein the transistor (MP1), the transistor (MN2), the node (nn3), the transistor (MP4), the transistor (MN4) and the node (nn4) form cross-coupled inverters in the master circuit.

In an embodiment, a short circuit path is formed between a source of a transistor (MN4) and a source of a transistor (MN2) when the clock is high, and wherein a ground voltage (VSS) is provided to the source of the transistor (MN4) and the source of the transistor (MN2) based on one of value of the input (D) and the inverted output (Db) being high, such that the a latch is formed in the master circuit.

In an embodiment, the input circuit provides the input (D) to a gate of a transistor (MN1) and the inverted output (Db) provided to a gate of a transistor (MN3), wherein a clock is provided to a gate of a transistor (MN5), wherein a source of the transistor (MN5) is connected with a drain of the transistor (MN1) and a source of a transistor (MN2), wherein a source of the transistor (MN5) is connected with a drain of the transistor (MN3) and a source of a transistor (MN4), wherein a drain of the transistor (MP5) is connected with a source of the transistor (MP2) and a source of the transistor (MP3), a power supply (VDD) is provided to the source of the transistor (MP5), wherein the input (D) is provided to a gate of the transistor (MP2), wherein the inverted output (Db) is provided to a gate of the transistor (MP3), wherein a drain of the transistor (MP5) is connected with the source of the transistor (MP2) and the transistor (MP3), and wherein a power supply (VDD) is provided at a source of a transistor (MP1) and a transistor (MP4).

In an embodiment, when the retention (RETN) is high ("1"), wherein the slave circuit receives the input (nn3 or nn4) from the master circuit. In the slave circuit (300), a current state of the node (X1) and the node (X2) corresponding to a transistor from a plurality of transistor is modified based on the input (nn3) and the input (nn4), when a clock is high. The slave circuit retains a value of a previous state irrespective of a change in outputs (nn3 and nn4) of the master circuit, when the clock is low ("0"). The slave circuit receives the input (nn3 and nn4) from the master circuit when the clock is low and then changes the state of the node (X1) and the node (X2) when the clock is high ("1"). The node (X1) and the node (X2) are responsible for forming a latch (MP7, MN7, MP9 and MN9) and a transistor (MP10) provides a short circuit path and provides a global power supply to the first node (n1) and the second node (n2) through a transistor (MP6 or MP8), when the clock is low ("0").

In an embodiment, if the retention signal (RETN) is high then, the retention signal enables the slave circuit retains a value of the previous state irrespective of an change in output (nn3 and nn4) of the master circuit, when the clock is low.

In an embodiment, a clock is provided at a gate of a transistor (MN11) and the retention signal (RETN) is provided at a gate of a transistor (MN10), where a drain of the transistor (MN11) is connected with a source of the transistor (MN10) in the slave circuit, wherein a source of the transistor (MN11) is connected to a drain of a transistor (MN6) and a drain of a transistor (MN8), wherein a source of the transistor (MN6) is connected to the node (X2) and a drain of the transistor (MN8) is connected with the node (X1).

In an embodiment, a source of transistor (MP11 and MP13) is provided with a global power supply (VDDG) and a drain of the transistor (MP11) is connected to the second node (n2) and a drain of the transistor (MP13) is connected with the first node (n1).

In an embodiment, the master circuit provides an input (nn3) to a gate of a transistor (MP6) and a gate of a transistor (MN6), wherein an input (nn4) is provided to a gate of a transistor (MP8) and a gate of transistor (MN8), wherein a clock is provided to a gate of a transistor (MP10), wherein a source of the transistor (MP10) is connected with a drain of the transistor (MP6) and a source of a transistor (MP7), wherein a source of the transistor (MP10) is connected with a drain of the transistor (MP8) and a source of a transistor (MP9).

In an embodiment, the output circuit receives data at a node (X1) as an input and provides an output value based on an input (D).

In an embodiment, the input is provided at a gate of a transistor (MP12) and a gate of a transistor (MN12), wherein a power supply (VDD) is provided at a source of the transistor (MP12) and a ground voltage (VSS) is provided at a source of the transistor (MN12), wherein a drain of the transistor (MP12) and a drain of the transistor (MN12) provide an output value (Q) based on the input (D) in the output circuit.

In an embodiment, the node (X2) is discharged through 3-stack of series connected transistors (MN6, MN11, and MN 10) and the node (X1) is charged through a 2 stack of series connected transistors (MP8 and MP9), so as to generate a slower delay path, when an output value (Q) is set to low in the output circuit.

In an embodiment, when the node (X1) is discharged through a 3-stack of series connected transistors (MN8, MN11, and MN10), so as to generate a faster delay path, when the value (Q) is set to high in the output circuit.

In an embodiment, an inverted output (Db) of the input circuit is charged to high through a transistor (MP0), a node (nn3) is charged through a 2-stack of series connected transistors (MP8 and MP2) and a node (nn4) is discharged through a 2 stack of series connected transistors (MN4 and MN3), so as to generate a faster delay path, when an input (D) is low in the input circuit (100).

In an embodiment, when a node (nn4) is charged through a 2-stack of series connected transistors (MP8 and MP3) and a node (nn3) is discharged through a 2 stack of series connected transistors (MN2 and MN1), so as to generate a slower delay path, when the input (D) is high in the input circuit and an inverted output (Db) of the input circuit is discharged to low through the transistor (MN0).

In an embodiment, the flip flop is a True Single-Phase Clock (TSPC) data-retention edge triggered flip flop.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

This method and system is illustrated in the accompanying drawings, throughout which like reference letters indicate corresponding parts in the various figures. The embodiments herein will be better understood from the following description with reference to the drawings, in which.

DETAILED DESCRIPTION OF INVENTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As is traditional in the field, embodiments may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

Accordingly, embodiments herein provides a flip flop comprising an input circuit, a master circuit, a slave circuit comprising a retention circuit, and an output circuit. The master circuit receives an input (D and Db) from the input circuit. At least one of the slave circuit and the retention circuit receives signals of nodes (nn3 and nn4) from the master circuit. The output circuit receives a signal of a node (X1) from at least one of the slave circuit and the retention circuit. A first node (n1) and a second node (n2) in the retention circuit receive a global power supply (VDDG) through transistors (MP11 and MP13), when a retention signal (RETN) is low in the retention circuit, so that the slave circuit retains current states of the node (X1) and a node (X2) irrespective of a clock input in the slave circuit, and the output circuit receives the stored state of the retention circuit, when a local power supply is turned ON.

Unlike conventional flip flops, a proposed flip flop according to example embodiments is operated based on a True-Single-Phase-Clock (TSPC) data retention which does not have a clock buffer and a retention (RETN) inverter for reducing an overall power consumption. The proposed flip flop intelligently utilizes a DRLK caution to reduce a number of transistors. The proposed flip-flop circuit has extremely low power and small area with less hit in an operation of the proposed flip-flop circuit. The proposed flip flop is used for a standard-cell library (e.g., 5 nm and 4 nm PBK Standard cell libraries, LF6, LF6S, CS28D libraries or the like). By using proposed TSPC data retention flip-flop circuit, the arrangement of the flip flop can easily reduce overall power.

Referring now to the drawings, and more particularly to FIGS. 2A, 2B, 2C and 3, where similar reference characters denote corresponding features consistently throughout the figures, there are shown preferred embodiments.

Figure 2A:
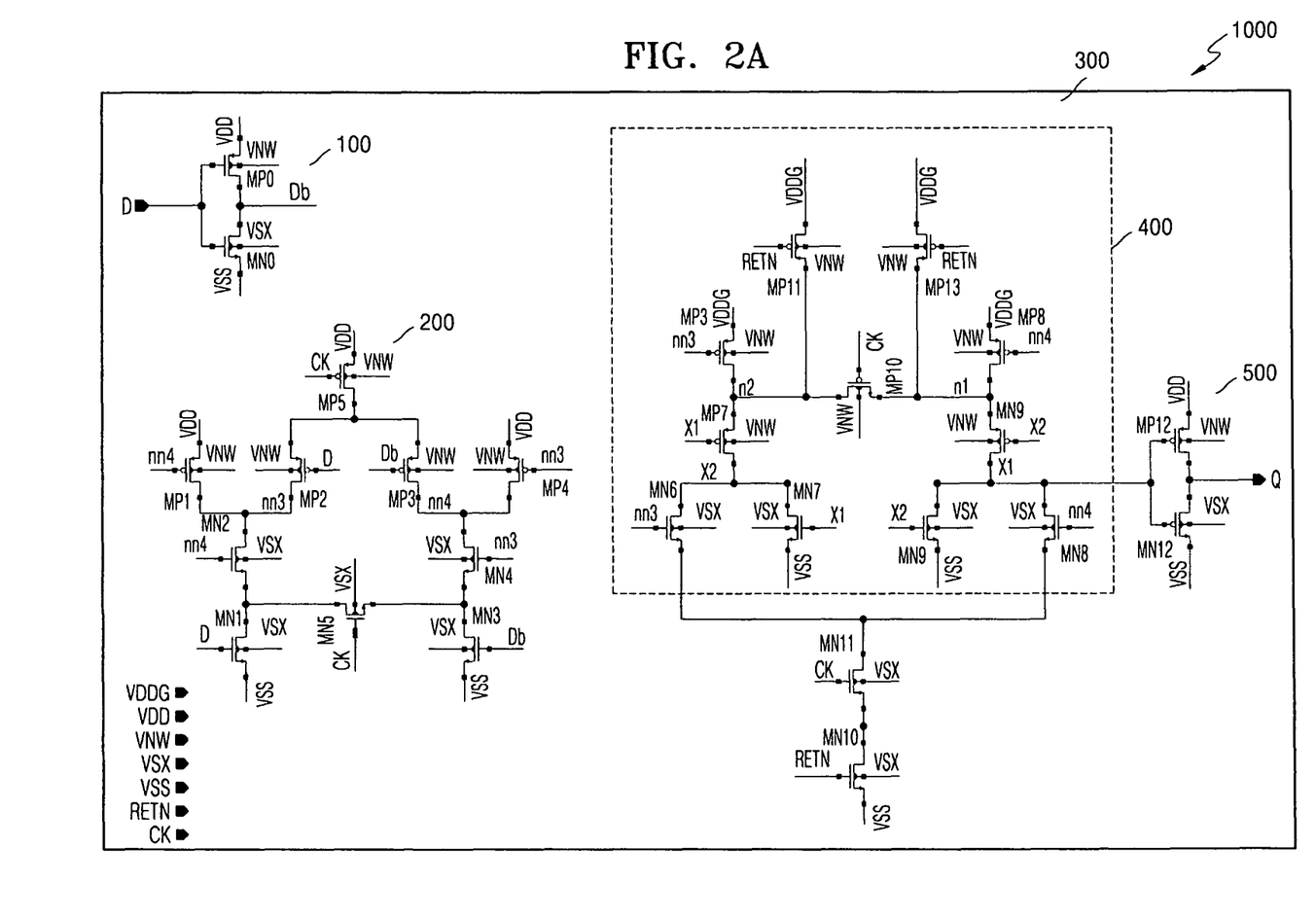
FIGS. 2A, 2B and 2C are circuit diagrams of a data retention flip-flop circuit, according to example embodiments.
Figure 2B:
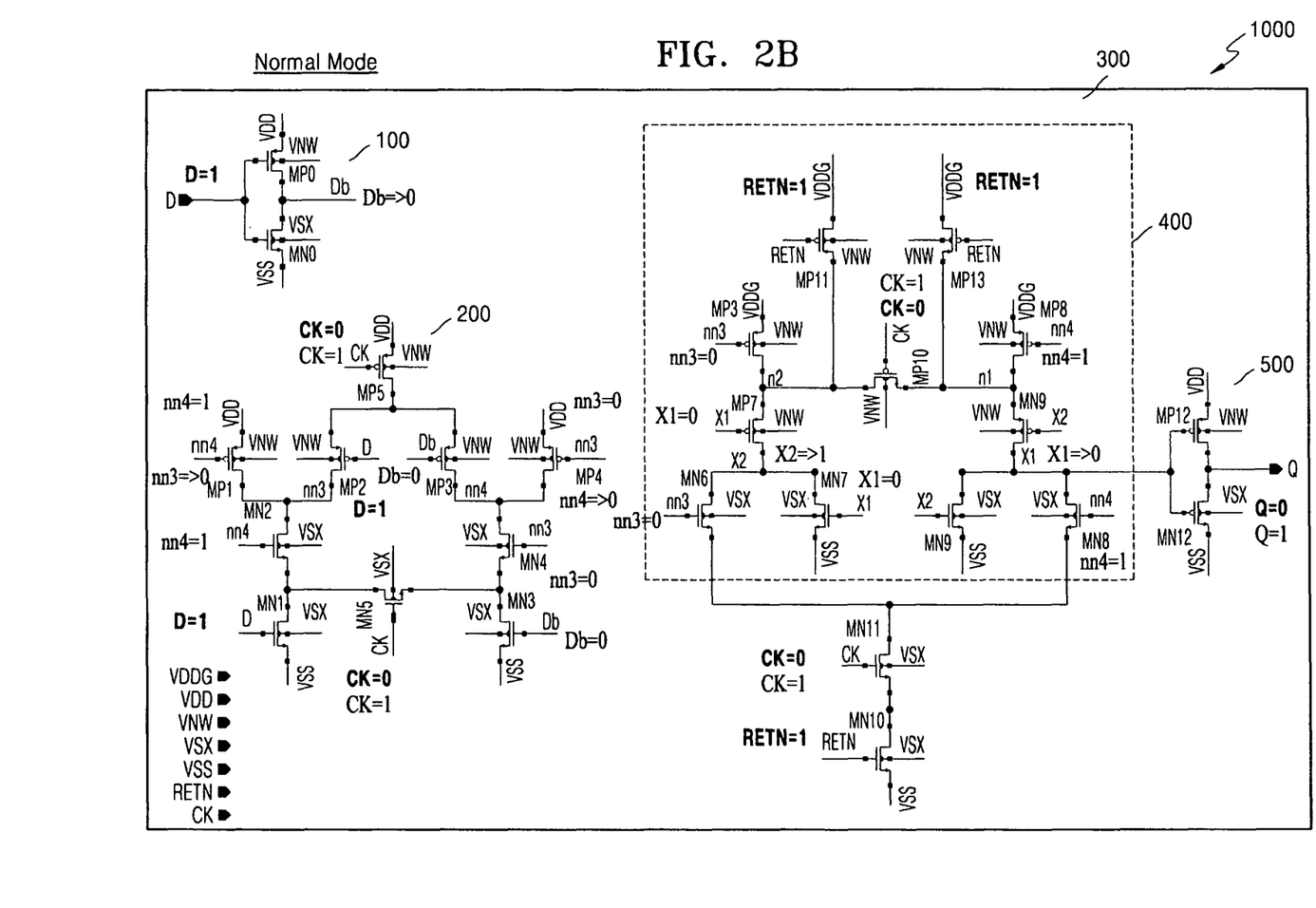
Figure 2C:
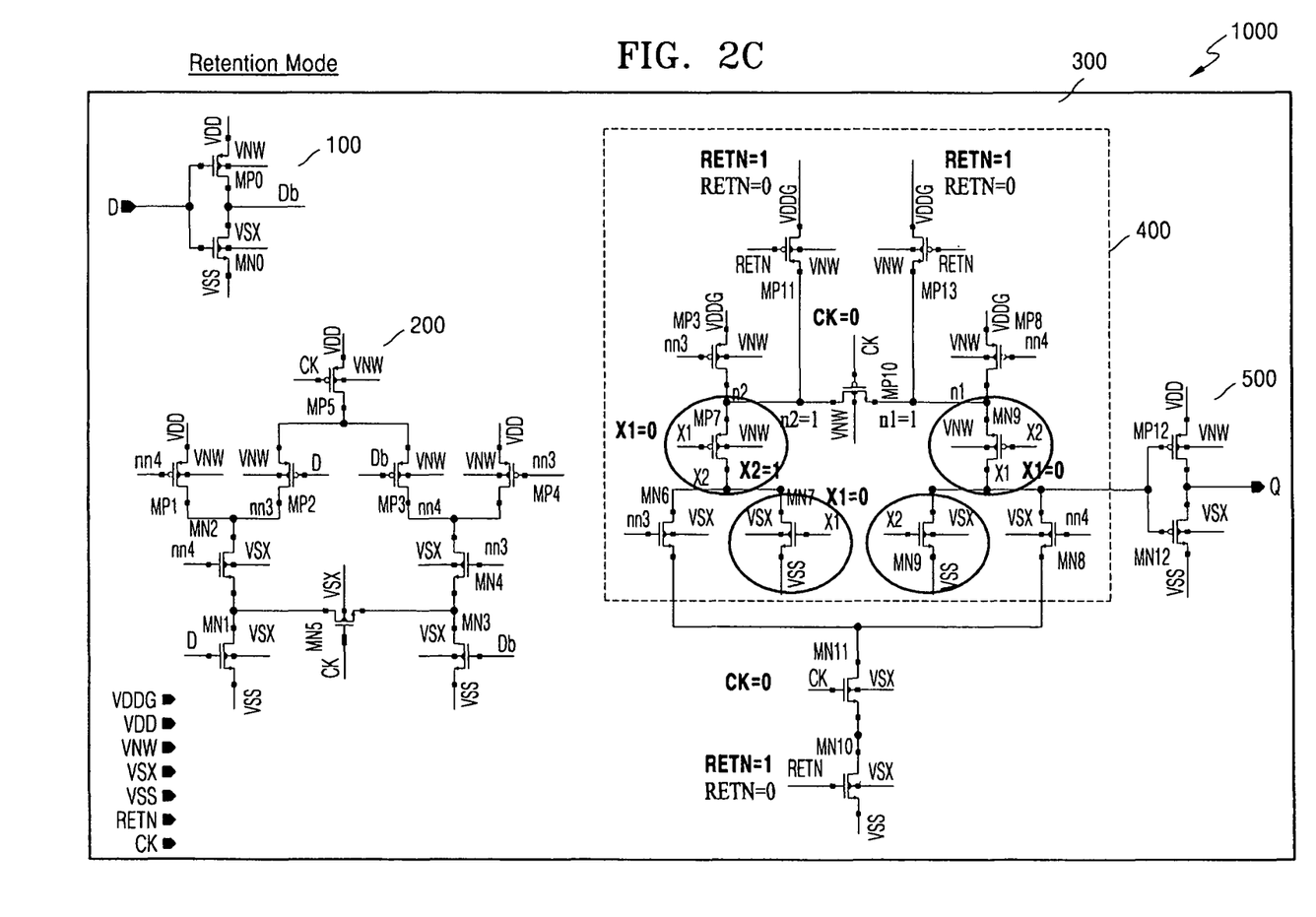

FIGS. 2A, 2B and 2C are circuit diagrams of data retention flip flops (1000), according to example embodiments. The data retention flip flop (1000) may be a True Single-Phase Clock (TSPC) data-retention edge triggered flip flop.

In an embodiment, a data retention flip flop (1000) comprises an input circuit (100), a master circuit (200), a slave circuit (300) comprising a retention circuit (400), and an output circuit (500). The master circuit (200) receives an input (D) and an inverted output (Db) from the input circuit (100). At least one of the slave circuit (300) and the retention circuit (400) receives signals of nodes (nn3 and nn4) from the master circuit (200). The output circuit (500) receives a signal of a node (X1) from at least one of the slave circuit (300) and the retention circuit (400). A first node (n1) and a second node (n2) in the retention circuit (400) are received a power supply from a global power supply (VDDG) through transistors (MP11 and MP13), when a retention signal (RETN) is low ("0") in the retention circuit (400), so that the slave circuit (300) retains current states of the nodes X1 and X2 irrespective of a clock input (or, clock signal CK) in the slave circuit (300), and the output circuit (500) receives the stored state of the retention circuit (400), when the power supply (VDD) is turned ON.

In some examples, the flip flop circuit is in a retention mode (i.e., the flip flop circuit operates in a retention mode) when the retention signal (RETN) is low and the flip flop circuit is in a normal mode (or, active mode) (i.e., the flip flop circuit operates in a normal mode) when the retention signal (RETN) is high.

In some examples, the power supply (VDD) may be turned off in the retention mode and turned on in the normal mode.

In some examples, the global power supply (VDDG) may be turned on in the retention mode and the normal mode.

In some examples, a voltage level of the global power supply (VDDG) may be lower than a voltage level of the power supply (VDD).

In an embodiment, if the retention signal (RETN) is low then, the slave circuit (300) is in a retention mode, so that the slave circuit (300) retains current states of the nodes X1 and X2 irrespective of the clock input.

In an embodiment, when the retention signal (RETN) is low, the first node (n1) and the second node (n2) receive the global power supply (VDDG) through transistors (MP11 and MP13), wherein the first node (n1) and the second node (n2) supply the global power supply (VDDG) to a latch formed by transistors (MP7, MN7, MP9 and MN9).

In an embodiment, the input circuit (100) receives the input (D) and provides the inverted output (Db) based on the received input (D). The input circuit (100) includes the input (D) provided to a gate of the transistors (MP0 and MN0). A ground voltage VSS is provided to a source of the transistor (MN0) and a power supply (VDD) is provided to a source of the transistors (MP0). Based on the received input (D), the inverted output (Db) is provided at drain of the transistor (MP0) and a drain of the transistor (MN0). In some examples, the input circuit (100) receives an input (Db) and provides an inverted output (D) based on the received input (Db), In an embodiment, the master circuit (200) receives the input and the inverted output (D and Db) from the input circuit (100). In the master circuit (200), a current state of each of a node (nn3) and a node (nn4) corresponding to a transistor from a plurality of transistors is modified based on the received input (D) and the inverted output (Db), when a clock (or, clock input CK) is low. The master circuit (200) retains a value of a previous state of each of the node (nn3) and the node (nn4), when the clock is high, even if the input (D) and the inverted output (Db) changes in the master circuit (200). The master circuit (200) does not generate any new value, wherein the clock is high. The master circuit (200) generates a value based on the received input from the input circuit (100), when the clock is low. In an embodiment, the value is "0". In another embodiment, the value is "1".

In an embodiment, a transistor (MP1) and a transistor (MN2) form an inverter with the node (nn3), and a transistor (MP4) and a transistor (MN4) form an inverter with the node (nn4), wherein the transistor (MP1), the transistor (MN2), the node (nn3), the transistor (MP4), the transistor (MN4) and the node (nn4) form cross-coupled inverters in the master circuit (200).

In an embodiment, a short circuit path is formed between a source of the transistor (MN4) and a source of the transistor (MN2), when the clock is high, and a ground voltage (VSS) is provided to the source of the transistor (MN4) and the source of the transistor (MN2) based on one of value of the input (D) and the inverted output (Db) being high, such that the latch (MP1, MN2, MN4 and MP4) is formed in the master circuit (200).

The input circuit (100) provides the input (D) to a gate of a transistor (MN1) and the inverted output (Db) provided to a gate of a transistor (MN3). The clock is provided to a gate of the transistor (MN5). A source of the transistor (MN5) is connected with a drain of the transistor (MN1) and a source of the transistor (MN2). A drain of the transistor (MN5) is connected with a drain of the transistor (MN3) and a source of the transistor (MN4). The clock is provided to a gate of the transistor (MP5). A drain of a transistor (MP5) is connected with a source of the transistor (MP2) and a source of a transistor (MP3). The power supply (VDD) is provided to the source of the transistor (MP5). The input (D) is provided to a gate of the transistor (MP2) and the inverted output (Db) is provided to a gate of the transistor (MP3), a drain of the transistor (MP8) is connected with the source of each of the transistor (MP2) and the transistor (MP3), the power supply (VDD) is provided at a source of each of the transistor (MP1) and the transistor (MP4).

In an embodiment, when the retention signal (RETN) is high ("1"), wherein the slave circuit (300) receives signals of the nodes (nn3 and nn4) from the master circuit (200). In the slave circuit (300), a current state of each of the node (X1) and the node (X2) corresponding to a transistor from a plurality of transistor is modified based on signals of the node (nn3) and the node (nn4), when a clock is high. The slave circuit (300) retains a value of a previous state irrespective of a change signals of the nodes (nn3 and nn4) of the master circuit (200), when the clock is low ("0"). The slave circuit (300) receives signals of the nodes (nn3 and nn4) from the master circuit (200) when the clock is low and then changes the state of each of the node (X1) and the node (X2) when the clock is high ("1"). The node (X1) and the node (X2) are responsible for forming a latch (MP7, MN7, MP9 and MN9) and a transistor (MP10) provides a short circuit path and provides a global power supply (VDDG) to the first node (n1) and the second node (n2) through a transistor (MP6 or MP8), when the clock is low ("0").

In the slave circuit (300), the clock is provided at a gate of a transistor (MN11) and the retention signal (RETN) is provided at a gate of a transistor (MN10). A source of the transistor (MN11) is connected with a drain of the transistor (MN10). A drain of the transistor (MN11) is connected to a source of a transistor (MN6) and a source of a transistor (MN8), wherein a drain of the transistor (MN6) is connected to the node (X2) and a drain of the transistor (MN8) is connected with the node (X1).

In an embodiment, a source of each of the transistors (MP11 and MP13) is provided with the global power supply (VDDG) and a drain of the transistor (MP11) is connected to the second node (n2) and a drain of the transistor (MP13) is connected with the first node (n1).

In an embodiment, the master circuit (200) provides a signal of the node (nn3) to a gate of the transistor (MP6) and a gate of the transistor (MN6), wherein a signal of the node (nn4) is provided to a gate of the transistor (MP8) and a gate of the transistor (MN8), wherein the clock is provided to a gate of the transistor (MP10), wherein a source of the transistor (MP10) is connected with a drain of the transistor (MP6) and a source of the transistor (MP7), wherein a drain of the transistor (MP10) is connected with a drain of the transistor (MP8) and a source of the transistor (MP9).

In an embodiment, the output circuit (500) receives a signal of the node (X1) as an input and provides an output value based on the received input. In the output circuit (500), an input is provided at a gate of the transistor (MP12) and a gate of the transistor (MN12). The power supply (VDD) is provided at a source of the transistor (MP12) and a ground voltage (VSS) is provided at a source of the transistor (MN12). The source of the transistor (MP12) and the source of the transistor (MN12) provide the output value based on the received input.

In the flip flop (1000), an operation of the clock buffer may be not needed so that power consumption of the flip flop (1000) is reduced. The retention (RETN) inverter may also be not needed in the flip flop (1000).

The FIGS. 2A, 2B and 2C show a flip flop (1000) according to example embodiments.

Consider, when the flip flop (1000) is in a normal mode, assume that Q=0, retention (RETN)=1, CK=0, and assume D=1 and the flip flop (1000) will make Q=1 at positive edge of CK (CK goes from 0 to 1). This is basic flip-flop functionality in the normal mode.

When D=1, Db=0, since CK=0 and Db=0, so, nn4=>1 (Hereinafter, "=>" may be referred to as "transition"), and now since nn4=1 and D=1, so, nn3=>0.

When CK goes from 0 to 1, since nn4=1 and CK=1 and retention (RETN)=1, so, X1=>0; Since X1=0, so, Q=1 hence data D=1 has arrived at Q at a positive edge of the clock; also, nn3=0 and X1=0, so, X2=1.

When the flip flop (1000) is in a retention mode, assume that X1=0, X2=1, retention (RETN)=1, CK=0. We will try to retain these values on X1 and X2 even if VDD=0 in the retention mode. This is flip-flop functionality in the retention mode. Now suppose RETN=>0, then retention mode is ON. Since, retention (RETN)=0 and CK=0, hence n1=1 (VDDG) and n2=1 (VDDG) irrespective of the states of the nodes nn3 and nn4. Now, the transistors (MP7, MN7, MP9, and MN9) formed cross-coupled inverters and hence X1 and X2 maintain their states with the global power supply VDDG. When the power supply VDD becomes 1 in the normal mode, then output Q is the same state as before.

Figure 3:
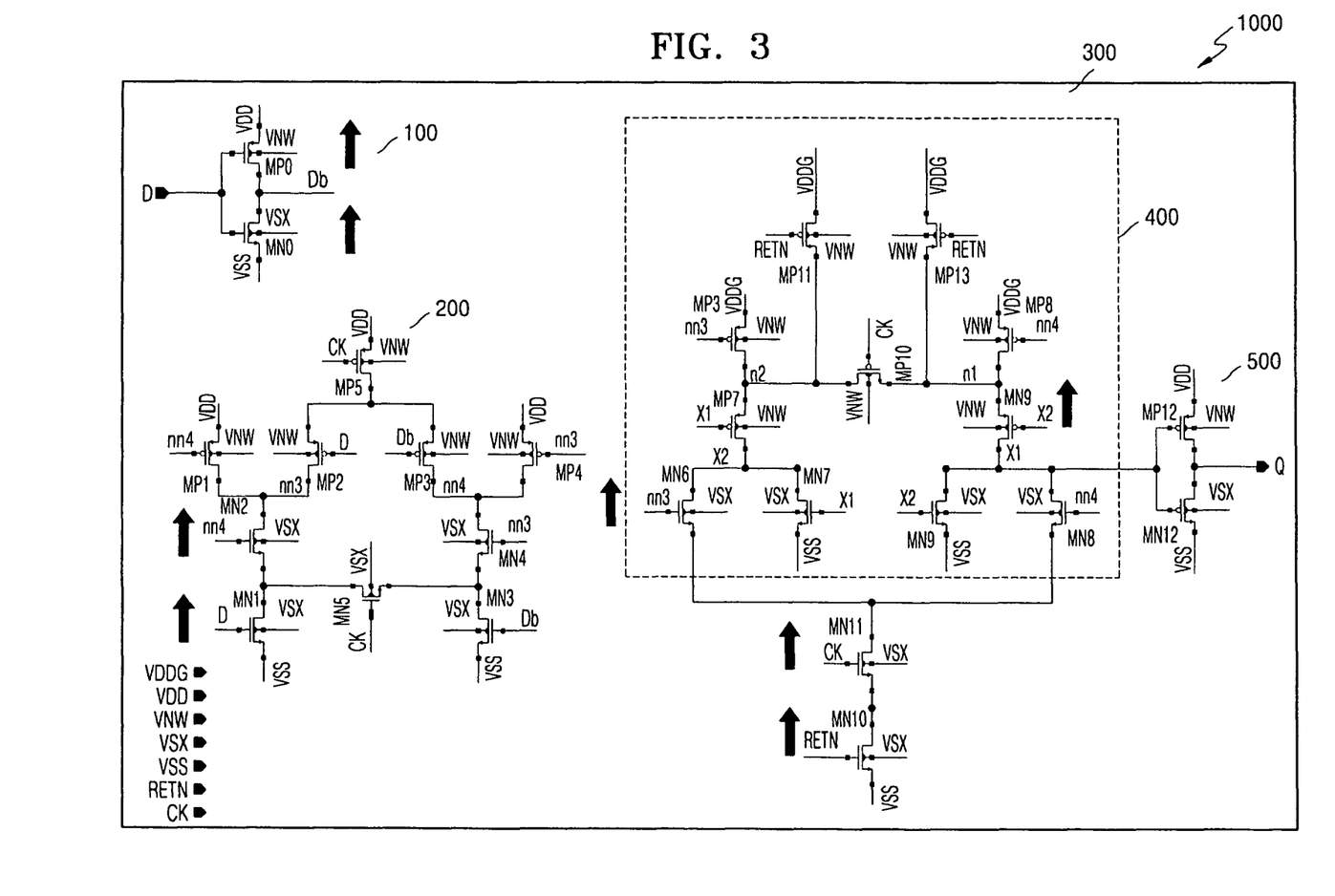
FIG. 3 is another circuit diagram of a data retention flip-flop circuit in which some transistors have been sized to full widths, according to example embodiments.

FIG. 3 is a circuit diagram of a data retention flip-flop circuit (1000) in which some transistors have been sized to increase, according to example embodiments. In an embodiment, increasing each width of some transistors in the retention circuit (400) and the master circuit (200) may improve a timing of delay of specific path in the flip flop (1000). The operations and functions of the flip flop (1000) are already explained in conjunction with the FIGS. 2A, 2B and 2C. The FIG. 3 shows the flip flop (1000) in a sized variant topology in which each width of the some transistors marked with arrow is increased to improve CK-to-Q delay. For the person ordinary skilled in the art, each width of the transistors are determined based on the implementation of the flip flop (1000).

As shown in the FIG. 3, when the output Q is set to low in the output circuit (500), node X2 is discharged through 3-stack of series connected transistors (i.e. MN6, MN11, and MN 10) and X1 is charged through 2 stack of series connected transistors (i.e. MP8 and MP9), so as to generate a slower delay path. When the output Q is set to high in the output circuit (500), node X1 is discharged through 3-stack of series connected transistors (i.e. MN8, MN11, and MN10), so as to generate a faster delay path. In order to compensate the slower delay path and faster delay path, increased the width of the transistor (MP9, MN6, MN11, and MN10).

As shown in the FIG. 3, when the input (D) is low in the input circuit (100) and the inverted output (Db) of the input circuit (100) is charged to high through the transistor (MP0), the node (nn3) is charged through a 2-stack of series connected transistors (i.e. MP8 and MP2) and the node (nn4) is discharged through a 2 stack of series connected transistors (i.e. MN4 and MN3), so as to generate a faster delay path. When the input (D) is high in the input circuit (100) and the inverted output (Db) of the input circuit (100) is discharged to low through the transistor (MN0), the node (nn4) is charged through a 2-stack of series connected transistors (i.e. MP8 and MP3) and the node nn3 is discharged through 2 stack of series connected transistors (i.e. MN2 and MN1), so as to generate a slower delay path. In order to compensate the slower delay path and faster delay path, increased each width of the transistors (MP0, MN0, MN2, and MN1).

The embodiments disclosed herein can be implemented using at least one software program running on at least one hardware device and performing network management functions to control the elements.

While the inventive concept has been described with reference to exemplary embodiments thereof, it will be apparent to those of ordinary skill in the art that various changes and modifications may be made thereto without departing from the spirit and scope of the invention as set forth in the following claims.

We claim:

1. A flip flop circuit comprising:
an input circuit configured to output an inverted output signal in response to an input signal;
a master circuit configured to output a first master output signal on a first master output node based on the input signal and a clock signal, and to output a second master output signal on a second master output node based on the inverted output signal and the clock signal;
a slave circuit including a first latch configured to output a first slave output signal on a first slave output node and a second slave output signal on a second slave output node based on the clock signal, a retention signal, and the first and second master output signals; and
an output circuit configured to output an output signal in response to one of the first and second slave output signals,
wherein the flip flop circuit is configured such that when the flip flop circuit is in a retention mode responsive to the retention signal, the slave circuit maintains current states of the first and second slave output signals irrespective of a state of the clock signal.

2. The flip flop circuit of claim 1, wherein the flip flop circuit is configured such that when the flip flop circuit is in the retention mode, the slave circuit maintains states of the first and second slave output signals further irrespective of states of the first and second master output signals.

3. The flip flop circuit of claim 1, wherein the input circuit, the master circuit, and the output circuit are supplied by a first power and the slave circuit is supplied by a second power, and
wherein the first power is higher than the second power and the second power is higher than a ground voltage.

4. The flip flop circuit of claim 3, wherein the flip flop circuit is configured such that:

when the flip flop circuit is in the retention mode, the first power is turned off and the second power is supplied to the slave circuit in response to the retention signal, and
when the flip flop circuit is in a normal mode, the first power is supplied to the master circuit in response to the clock signal and the second power is supplied to the slave circuit in response to the first and second master output signals.

5. The flip flop circuit of claim 3, wherein the flip flop circuit is configured such that when the flip flop circuit is in a normal mode:
in response to the clock signal being high, the slave circuit outputs the first and second slave output signals based on the first and second master output signals, and
in response to the clock signal being low, the slave circuit maintains states of the first and second slave output signals based on a state of one of the first and second master output signals.

6. The flip flop circuit of claim 3, wherein the first latch includes cross-coupled inverters including a first inverter and a second inverter connected to each other,
wherein the first inverter is configured to output the first slave output signal in response to the second slave output signal, and
wherein the second inverter is configured to output the second slave output signal in response to the first slave output signal.

7. The flip flop circuit of claim 6, wherein the first inverter includes:
a third transistor having a source connected to a first node, a drain connected to the first slave output node, and a gate receiving the second slave output signal, and
a fourth transistor having a source connected to the ground voltage, a drain connected to the second slave output node, and a gate receiving the second slave output signal, and
wherein the second inverter includes:
a fifth transistor having a source connected to a second node, a drain connected to the second slave output node, and a gate receiving the first slave output signal, and
a sixth transistor having a source connected to the ground voltage, a drain connected to the second slave output node, and a gate receiving the first slave output signal.

8. The flip flop circuit of claim 7, wherein a width of the third transistor is larger than a width of the fifth transistor.

9. The flip flop circuit of claim 7, wherein the slave circuit further includes:
a seventh transistor including a gate receiving the clock signal,
an eighth transistor including a source connected to the ground voltage, a drain connected to a source of the seventh transistor, and a gate receiving the retention signal,
a ninth transistor including a source connected to a drain of the seventh transistor, a drain connected to the second slave output node, and a gate receiving the first master output signal,
a tenth transistor including a source connected to the drain of the seventh transistor, a drain connected to the first slave output node, and a gate receiving the second master output signal,
an eleventh transistor including a source connected to the second power, a drain connected to the second node, and a gate receiving the first master output signal, and a twelfth transistor including a source connected to the second power, a drain connected to the first node, and a gate receiving the second master output signal.

10. The flip flop circuit of claim 9, wherein a width of the ninth transistor is larger than a width of the tenth transistor.

11. The flip flop circuit of claim 7, wherein the slave circuit further includes seventh and eighth transistors connected to the second power, and wherein when the flip flop circuit is in the retention mode, the seventh transistor supplies the second power to the first node in response to the retention signal and the eighth transistor supplies the second power to the second node in response to the retention signal.

12. The flip flop circuit of claim 1, wherein the master circuit includes a second latch including cross-coupled inverters connected to a first power, wherein the cross-coupled inverters includes a first inverter and a second inverter, wherein the first inverter is configured to output the first master output signal on a first master output node in response to the second master output signal, and wherein the second inverter is configured to output the second master output signal on a second master output node in response to the first master output signal.

13. The flip flop circuit of claim 12, wherein the master circuit includes:

a third transistor including a source connected to a ground voltage, a drain connected to the first inverter, and a gate receiving the input signal, a fourth transistor including a source connected to the ground voltage, a drain connected to the second inverter, and a gate receiving the inverted output signal, a fifth transistor connected between the drain of the third transistor and the drain of the fourth transistor, and including a gate receiving the clock signal, a sixth transistor including a drain connected to the first master output node and a gate receiving the input signal, a seventh transistor including a drain connected to the second master output node and a gate receiving the inverted output signal, and an eighth transistor including a drain connected to the sources of the sixth transistor and the seventh transistor, a source connected to the first power, and a gate receiving the clock signal.

14. The flip flop circuit of claim 13, wherein a width of the third transistor is larger than a width of the fourth transistor.

15. A flip flop circuit comprising:

an input circuit configured to output an inverted output signal in response to an input signal;

a master circuit including first cross-coupled inverters configured to output a first master output signal and a second master output signal based on the input signal, the inverted output signal, and a clock signal;

a slave circuit including second cross-coupled inverters configured to output a first slave output signal and a second slave output signal based on the clock signal, a retention signal, and the first and second master output signals; and an output circuit configured to output an output signal in response to one of the first and second slave output signals, wherein the flip flop circuit is configured such that when the retention signal is either low or high, the slave circuit maintains current states of the first and second slave output signals irrespective of a state of the clock signal.

16. The flip flop circuit of claim 15, wherein the input circuit, the master circuit, and the output circuit are supplied by a first power and the slave circuit is supplied by a second power, and wherein the first power and the second power are higher than a ground voltage.

17. The flip flop circuit of claim 16, wherein the first cross-coupled inverters includes a first inverter and a second inverter connected to each other, wherein the first inverter is configured to output the first master output signal in response to the second master output signal, and wherein the second inverter is configured to output the second master output signal in response to the first master output signal.

18. The flip flop circuit of claim 16, wherein the second cross-coupled inverters including a first inverter and a second inverter connected to each other, wherein the first inverter is configured to output the first slave output signal in response to the second slave output signal, and wherein the second inverter is configured to output the second slave output signal in response to the first slave output signal.

19. A flip flop circuit comprising:

an input circuit connected to a first power, and configured to output an inverted output signal in response to an input signal;

a master circuit connected to the first power, and configured to output a first master output signal and a second master output signal based on the input signal, the inverted output signal, and a clock signal;

a slave circuit connected to a second power, and configured to output a first slave output signal and a second slave output signal based on the clock signal, a retention signal, and the first and second master output signals; and an output circuit connected to the first power, and configured to output an output signal in response to one of the first and second slave output signals, wherein the flip flop circuit is configured such that when the flip flop circuit is in a retention mode responsive to the retention signal, the slave circuit maintains current states of the first and second slave output signals irrespective of a state of the clock signal, wherein the flip flop circuit is configured that when the flip flop circuit is in a normal mode responsive to the retention signal, the slave circuit outputs the first and second slave output signals based on the clock signal and first and second master output signals, and wherein the first power and the second power are different from each other and higher than a ground voltage.

20. The flip flop circuit of claim 19, wherein the flip flop circuit is configured such that:

when the flip flop circuit is in the normal mode, the second power is supplied to the slave circuit based on the first and second master output signals, and when the flip flop circuit is in the retention mode, the second power is supplied to the slave circuit irrespective of states of the first and second master output signals.

* * * * *